United States Patent
Goslin

(10) Patent No.: US 11,351,472 B2
(45) Date of Patent: Jun. 7, 2022

(54) SYSTEMS AND METHODS FOR USING A GYROSCOPE TO CHANGE THE RESISTANCE OF MOVING A VIRTUAL WEAPON

(71) Applicant: DISNEY ENTERPRISES, INC., Burbank, CA (US)

(72) Inventor: Michael P. Goslin, Burbank, CA (US)

(73) Assignee: DISNEY ENTERPRISES, INC., Burbank, CA (US)

( * ) Notice: Subject to any disclaimer, the term of this patent is extended or adjusted under 35 U.S.C. 154(b) by 1393 days.

(21) Appl. No.: 15/001,188

(22) Filed: Jan. 19, 2016

(65) Prior Publication Data

US 2017/0203225 A1 Jul. 20, 2017

(51) Int. Cl.
*A63H 33/00* (2006.01)
*F41B 13/02* (2006.01)
*G06F 30/20* (2020.01)

(52) U.S. Cl.
CPC .......... *A63H 33/009* (2013.01); *F41B 13/02* (2013.01); *G06F 30/20* (2020.01)

(58) Field of Classification Search
CPC .... G06F 17/5009; A63H 33/009; F41B 13/02
See application file for complete search history.

(56) References Cited

U.S. PATENT DOCUMENTS

| | | |
|---|---|---|
| RE34,728 E | 9/1994 | Hall-Tipping |
| 6,152,856 A | 11/2000 | Studor |
| 6,162,123 A | 12/2000 | Woolston |
| 6,817,979 B2 | 11/2004 | Jukka |
| 7,128,693 B2 | 10/2006 | Brown |
| 7,402,105 B1 | 7/2008 | Hutter |
| 7,719,563 B2 | 5/2010 | Richards |
| 7,765,111 B2 | 7/2010 | Brown |
| 8,016,680 B1 | 9/2011 | Hutter |
| 8,506,396 B1 | 8/2013 | Snyder |
| 8,597,121 B2 | 12/2013 | Andres Del Valle |
| 8,612,363 B2 | 12/2013 | Karkanias |
| 9,101,837 B1 | 8/2015 | Snyder |

(Continued)

FOREIGN PATENT DOCUMENTS

CN 109068161 12/2018

OTHER PUBLICATIONS

Dictionary.com, Defintion of lightsaber, 2019, Dictionary.com, pp. 1-2 (Year: 2019).*

(Continued)

*Primary Examiner* — Boris Gorney
*Assistant Examiner* — Bernard E Cothran
(74) *Attorney, Agent, or Firm* — Esplin & Associates, PC

(57) ABSTRACT

This disclosure relates to systems and methods for using a gyroscope to change the resistance of moving a virtual weapon to simulate a feel of moving the virtual weapon. A feel of moving a virtual weapon may be simulated by determining a position and/or an orientation of a virtual blade of the virtual weapon, determining controls for a gyroscope based on the position and/or the orientation of the virtual blade, and operating the gyroscope in accordance with the controls for the gyroscope to provide resistance to changing the orientation of the hilt, wherein the resistance to changing the orientation of the hilt simulates the feel of moving the virtual weapon.

21 Claims, 15 Drawing Sheets

(56) References Cited

U.S. PATENT DOCUMENTS

| | | | |
|---|---|---|---|
| 9,364,746 B2 | 6/2016 | Chudley | |
| 9,931,539 B1 | 4/2018 | De Pablos | |
| 9,972,138 B2 | 5/2018 | Goslin | |
| 10,223,836 B2 | 3/2019 | Goslin | |
| 10,300,372 B2 | 5/2019 | Goslin | |
| 10,304,251 B2 | 5/2019 | Pahud | |
| 10,481,680 B2 | 11/2019 | Panec | |
| 10,546,431 B2 | 1/2020 | Hsu | |
| 10,587,834 B2 | 3/2020 | Goslin | |
| 2002/0024675 A1* | 2/2002 | Foxlin | G06F 3/0346 356/620 |
| 2004/0002634 A1 | 1/2004 | Nihtila | |
| 2004/0077462 A1 | 4/2004 | Brown | |
| 2005/0101845 A1 | 5/2005 | Nihtila | |
| 2007/0126700 A1 | 6/2007 | Wright | |
| 2007/0252815 A1 | 11/2007 | Kuo | |
| 2008/0039206 A1 | 2/2008 | Ackley | |
| 2008/0146334 A1 | 6/2008 | Kil | |
| 2008/0274805 A1 | 11/2008 | Ganz | |
| 2009/0307611 A1 | 12/2009 | Riley | |
| 2009/0309891 A1 | 12/2009 | Karkanias | |
| 2009/0325701 A1 | 12/2009 | Andres Del Valle | |
| 2010/0261526 A1 | 10/2010 | Anderson | |
| 2011/0250962 A1 | 10/2011 | Feiner | |
| 2012/0050535 A1 | 3/2012 | Densham | |
| 2012/0254749 A1 | 10/2012 | Downs, III | |
| 2012/0262365 A1 | 10/2012 | Mallinson | |
| 2012/0327117 A1 | 12/2012 | Weller | |
| 2013/0042296 A1* | 2/2013 | Hastings | G06F 21/10 726/1 |
| 2013/0044128 A1 | 2/2013 | Liu | |
| 2013/0229396 A1 | 9/2013 | Huebner | |
| 2013/0286004 A1 | 10/2013 | McCulloch | |
| 2014/0002329 A1 | 1/2014 | Nishimaki | |
| 2014/0003651 A1 | 1/2014 | Smoot | |
| 2014/0078517 A1 | 3/2014 | Ben-Yishai | |
| 2014/0080109 A1* | 3/2014 | Haseltine | A63F 13/06 434/308 |
| 2014/0104169 A1 | 4/2014 | Masselli | |
| 2014/0116469 A1 | 5/2014 | Kim | |
| 2014/0160117 A1 | 6/2014 | Nehmadi | |
| 2015/0035677 A1 | 2/2015 | Williams | |
| 2015/0201188 A1 | 7/2015 | Pritch | |
| 2015/0243286 A1 | 8/2015 | Goslin | |
| 2015/0248785 A1 | 9/2015 | Holmquist | |
| 2016/0055677 A1 | 2/2016 | Kuffner | |
| 2016/0189411 A1 | 6/2016 | Matsunaga | |
| 2016/0206957 A1 | 7/2016 | Goslin | |
| 2016/0247324 A1 | 8/2016 | Mullins | |
| 2016/0253842 A1 | 9/2016 | Shapira | |
| 2016/0260261 A1 | 9/2016 | Hsu | |
| 2016/0274662 A1 | 9/2016 | Rimon | |
| 2016/0299563 A1 | 10/2016 | Stafford | |
| 2016/0327798 A1 | 11/2016 | Xiao | |
| 2016/0352930 A1 | 12/2016 | Fujita | |
| 2017/0087465 A1 | 3/2017 | Lyons | |
| 2017/0124713 A1 | 5/2017 | Jurgenson | |
| 2017/0132841 A1 | 5/2017 | Morrison | |
| 2017/0161561 A1 | 6/2017 | Marty | |
| 2017/0203225 A1 | 7/2017 | Goslin | |
| 2017/0213387 A1 | 7/2017 | Bean | |
| 2017/0228936 A1 | 8/2017 | Goslin | |
| 2017/0257594 A1 | 9/2017 | Goslin | |
| 2017/0295229 A1 | 10/2017 | Shams | |
| 2018/0081439 A1 | 3/2018 | Daniels | |
| 2018/0173300 A1 | 6/2018 | Schwarz | |
| 2018/0190017 A1 | 7/2018 | Mendez | |
| 2018/0204362 A1 | 7/2018 | Tinsman | |
| 2018/0239144 A1 | 8/2018 | Woods | |
| 2018/0295324 A1 | 10/2018 | Clark | |
| 2018/0350056 A1 | 12/2018 | Cardenas Bernal | |
| 2018/0350118 A1 | 12/2018 | Bastaldo-Tsampalis | |
| 2018/0365893 A1 | 12/2018 | Mullins | |
| 2019/0019346 A1 | 1/2019 | Cuthbertson | |
| 2019/0243446 A1 | 8/2019 | Panec | |
| 2019/0304191 A1 | 10/2019 | Hsu | |
| 2019/0329405 A1 | 10/2019 | Atohira | |
| 2020/0037144 A1 | 1/2020 | Chen | |
| 2020/0101372 A1 | 4/2020 | Drake | |
| 2021/0001171 A1 | 1/2021 | Fung | |

OTHER PUBLICATIONS

Star Wars, Lightsaber, 2020, StarWars.com, p. 1 (Year: 2020).*

Virtual and Augmented Reality, Oct. 2016, Citi GPS: Global Perspectives & Solutions. (128 pages).

Hashimoto, Sunao, et al., "Touch Me: An Augmented Realtiy Based Remote Robot Manipulation", The 21st International Conference on Artificial Reality and Telexistence, Nov. 28-30, 2011, Osaka, Japan, The Virtual Relaity Society of Japan, pp. 61-66 (Year: 2011).

* cited by examiner

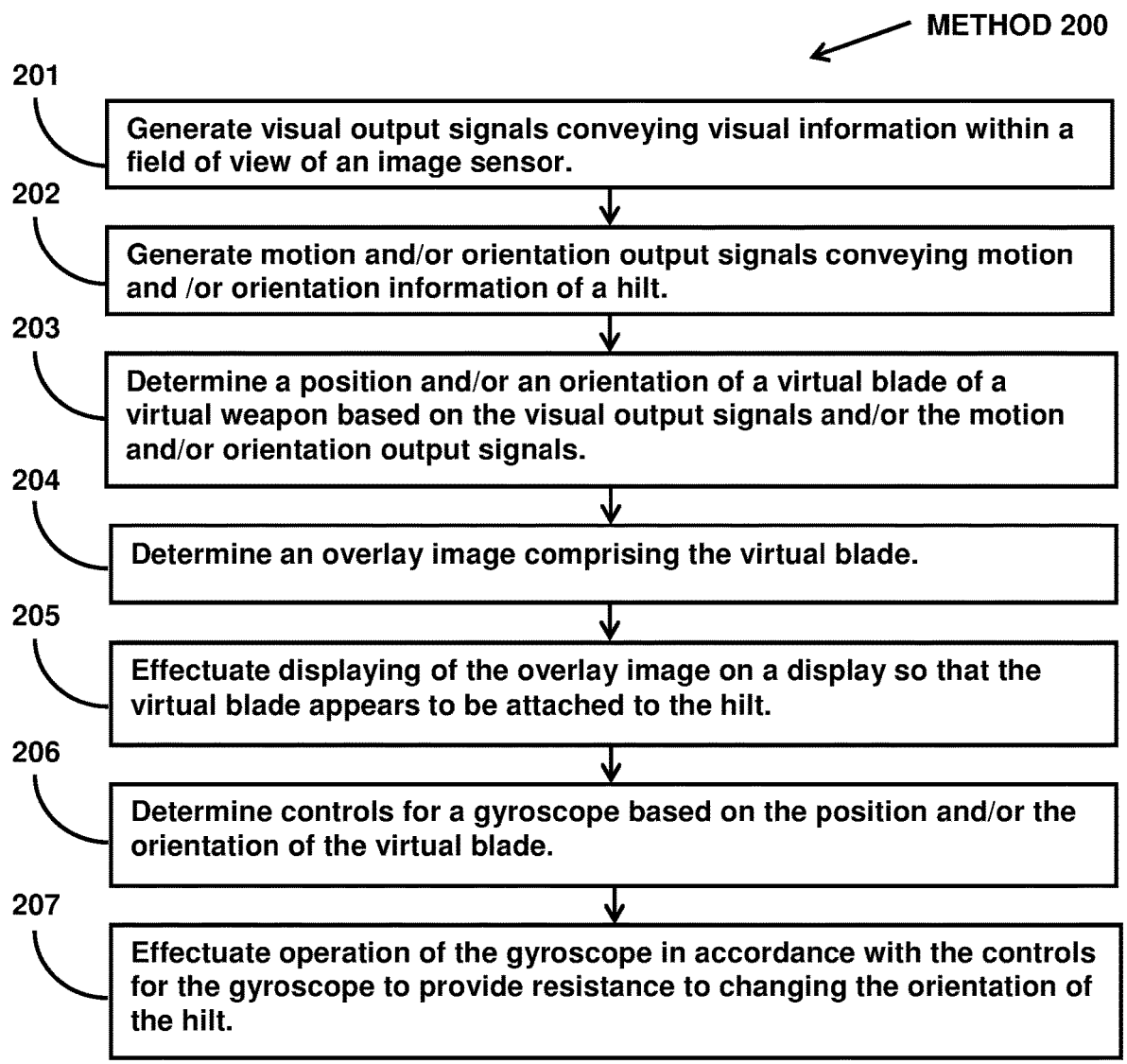

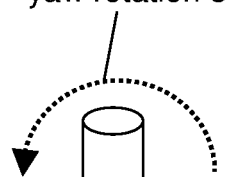
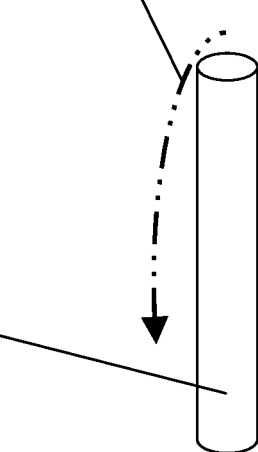
FIG. 3C  FIG. 3D
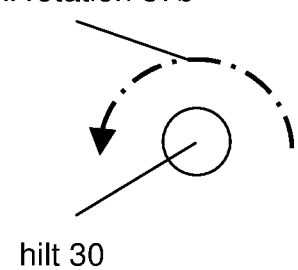
FIG. 3E

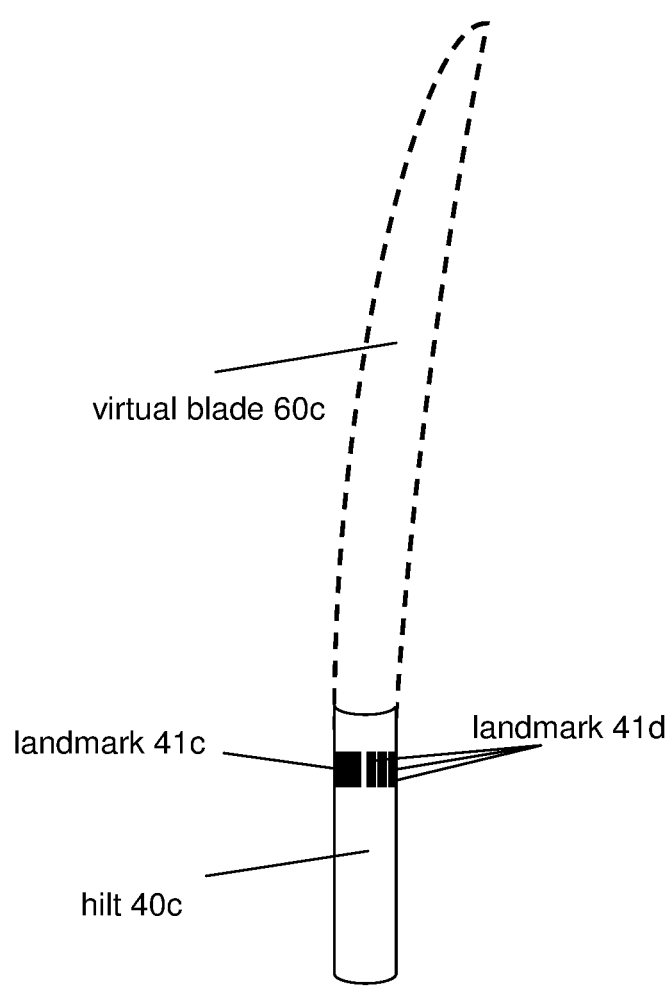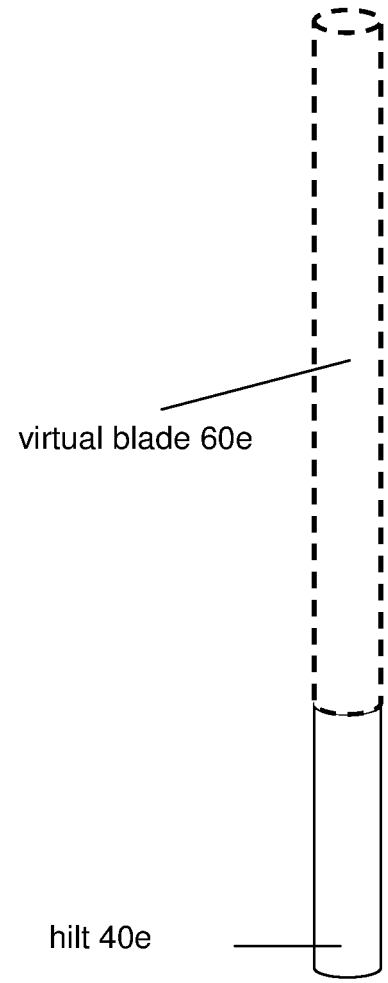
FIG. 6C
FIG. 6D

SYSTEMS AND METHODS FOR USING A GYROSCOPE TO CHANGE THE RESISTANCE OF MOVING A VIRTUAL WEAPON

FIELD

This disclosure relates to systems and methods for using a gyroscope to change the resistance of moving a virtual weapon to simulate a feel of moving the virtual weapon.

BACKGROUND

Toy weapons that include a hilt and a blade are known. Such toys do not change the resistance of moving the toy to simulate a feel of moving a virtual weapon.

SUMMARY

This disclosure relates to using a gyroscope to change the resistance of moving a virtual weapon to simulate a feel of moving the virtual weapon. A feel of moving a virtual weapon may be simulated by determining a position and/or an orientation of a virtual blade of the virtual weapon, determining an overlay image comprising the virtual blade, where the virtual blade is placed within the overlay image according to the position and/or the orientation of the virtual blade, displaying the overlay image so that the virtual blade appears to be attached to the hilt, determining controls for a gyroscope based on the position and/or the orientation of the virtual blade, and operating the gyroscope in accordance with the controls for the gyroscope to provide resistance to changing the orientation of the hilt, wherein the resistance to changing the orientation of the hilt simulates the feel of moving the virtual weapon.

A system configured to simulate a feel of moving a virtual weapon may include a display, an image sensor, a hilt, a motion and orientation sensor, a gyroscope, one or more processors, and/or other components. In some implementations, the system may include a speaker. In some implementations, the system may include a haptic generator. In some implementations, the image sensor and the one or more processors may be carried on the display, and the field of view of the image sensor may be a function of the position and the orientation of the display.

The display may be configured to display an overlay image. In some implementations, the display may include one or more of a head-mounted display, an optical head-mounted display, a see-through display, an optical see-through display, a video see-through display, a visor, eyeglasses, sunglasses, a smartphone, a tablet, a mobile device, a projector, and/or other displays.

The image sensor may be configured to generate visual output signals conveying visual information within a field of view of the image sensor. The image sensor may include one or more of a charge-coupled device sensor, an active pixel sensor, a complementary metal-oxide semiconductor sensor, an N-type metal-oxide-semiconductor sensor, and/or other image sensors.

The motion and orientation sensor may be carried by the hilt. The motion and orientation sensor may be configured to generate motion and/or orientation output signals conveying motion and/or orientation information of the hilt. In some implementations, the motion and orientation sensor may include an inertial measurement unit and/or other motion and orientation sensors.

The gyroscope may be carried by the hilt. In some implementations, the gyroscope may include a first gyroscope carried in a first portion of the hilt and a second gyroscope carried in a second portion of the hilt. The first portion and the second portion may be located in different ends of the hilt.

The one or more processors may be configured to determine a position and/or an orientation of a virtual blade of the virtual weapon based on the visual output signals and/or the motion and/or orientation output signals. When the hilt is within the field of view of the image sensor, the one or more processors may be configured to determine a position and/or an orientation of the virtual blade based on the visual output signals.

In some implementations, the one or more processors may be configured to determine the position and/or the orientation of the virtual blade based on a position and/or an orientation of a landmark. The landmark may be carried by the hilt. The landmark may indicate a reference point for the hilt that facilitates determination of a position and/or an orientation of the virtual blade. In some implementations, the landmark may include a light emitting diode and/or other landmarks.

When the hilt is not within the field of view of the image sensor, the one or more processors may be configured to determine the position and/or the orientation of the virtual blade based on the motion and/or orientation output signals. In some implementations, the one or more processors may be configured to determine the position and/or the orientation of the virtual blade based on the visual output signals and based on the motion and/or orientation output signals.

In some implementations, the one or more processors may be configured to select the virtual blade based on a user input received through an input device. An input device may include a key entry device, a touch entry device, an imaging device, a sound device, and/or other input devices. In some implementations, the one or more processors may be configured to select the virtual blade based on a landmark.

The one or more processors may be configured to determine an overlay image. The overlay image may comprise a virtual blade of a virtual weapon. The virtual blade may be placed within the overlay image according to the position and/or the orientation of the virtual blade.

The one or more processors may be configured to effectuate displaying of the overlay image on the display. The displaying may be effectuated so that the virtual blade appears to be attached to the hilt.

The one or more processors may be configured to determine controls for the gyroscope based on the position and/or the orientation of the virtual blade. The controls for the gyroscope may determine one or more of speed and/or direction of rotation of the gyroscope around one or more axis at a time, over a period of time, at a location, or over a range of locations.

In some implementations, the one or more processors may be configured to determine changes in the position and/or the orientation of the virtual blade. The one or more processors may be configured to determine the controls for the gyroscope based on the changes in the position and/or the orientation of the virtual blade.

In some implementations, the one or more processors may be configured to detect an object based on the visual output signals. The object may be a physical object or a virtual object. The one or more processors may be configured to determine when the virtual blade touches the object. The one or more processors may be configured to determine the controls for the gyroscope based on the virtual blade touching the object.

In some implementations, the one or more processors may be configured to change the type, the shape and/or the size of the virtual blade. The one or more processors may be configured to determine the controls for the gyroscope based on the changed type, the changed shape and/or the changed size of the virtual blade The one or more processors may be configured to effectuate operation of the gyroscope in accordance with the controls for the gyroscope. The gyroscope may be operated to provide resistance to changing the orientation of the hilt. The resistance to changing the orientation of the hilt may simulate the feel of moving the virtual weapon.

In some implementations, the one or more processors may be configured to effectuate operation of the speaker. The operation of the speaker may be effectuated in response to changes in the position and/or the orientation of the virtual blade based one or more of the visual output signals and/or the motion and/or orientation output signals.

In some implementations, the one or more processors may be configured to effectuate operation of the haptic generator. The operation of the haptic generator may be effectuated in response to changes in the position and/or the orientation of the virtual blade based one or more of the visual output signals and/or the motion and/or orientation output signals.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

FIG. 2 illustrates a method for simulating a feel of moving a virtual weapon.

FIGS. 3C-3E illustrate examples of rotations of a hilt.

DETAILED DESCRIPTION

Figure 1:
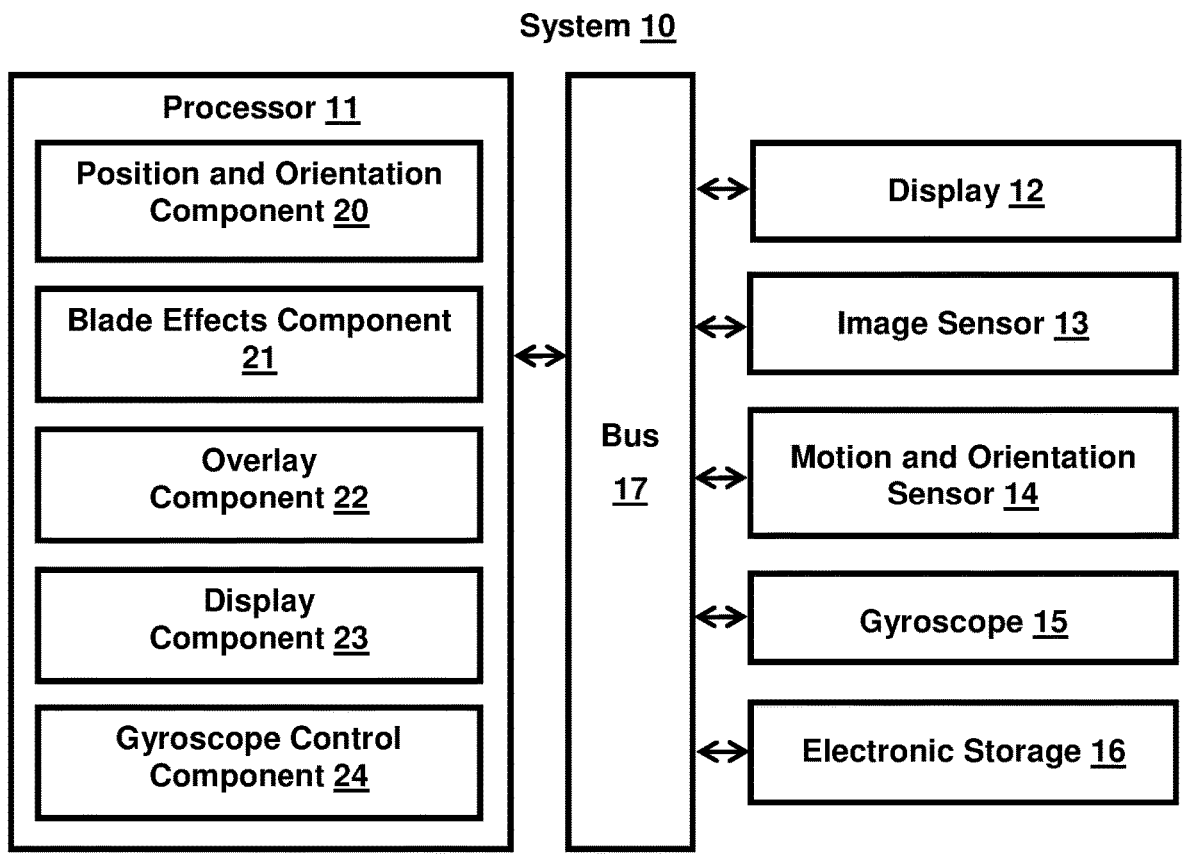
FIG. 1 illustrates a system configured to simulate a feel of moving a virtual weapon.

FIG. 1 illustrates a system 10 configured to simulate a feel of moving a virtual weapon. System 10 may include one or more of processor 11, display 12, image sensor 13, motion and orientation sensor 14, gyroscope 15, electronic storage 16, bus 17, a hilt, and/or other components. The hilt may be configured to carry (e.g., attach to, support, hold, and/or otherwise carry) one or more components of system 10. To simulate a feel of moving a virtual weapon, a position and/or an orientation of a virtual blade of the virtual weapon may be determined. The virtual blade may be selected and placed within an overlay image according to the position and/or the orientation of the virtual blade. The overlay image may be displayed so that the virtual blade appears to be attached to the hilt. Controls for gyroscope 15 may be determined based on the position and/or the orientation of the virtual blade. Gyroscope 15 may be operated in accordance with the controls for gyroscope 15 to provide resistance to changing the orientation of hilt. The resistance to changing the orientation of hilt may simulate the feel of moving the virtual weapon. In some implementations, system 10 may include a speaker. In some implementations, system 10 may include a haptic generator.

Display 12 may be configured to display an overlay image. In some implementations, display 12 may include one or more of a head-mounted display, an optical head-mounted display, a see-through display, an optical see-through display, a video see-through display, a visor, eyeglasses, sunglasses, a smartphone, a tablet, a mobile device, a projector, and/or other displays. In some implementations, processor 11 and image sensor 13 may be carried on display 12, and the field of view of image sensor 13 may be a function of the position and the orientation of display 12.

Image sensor 13 may be configured to generate visual output signals conveying visual information within the field of view of image sensor 13. Visual information may include one or more of an image, a video, and/or other visual information. When a hilt is within the field of view of image sensor 13, visual information may include one or more of an image, a video, and/or other visual information regarding the hilt. Image sensor 13 may include one or more of a charge-coupled device sensor, an active pixel sensor, a complementary metal-oxide semiconductor sensor, an N-type metal-oxide-semiconductor sensor, and/or other image sensors.

Motion and orientation sensor 14 may be carried by the hilt. Motion and orientation sensor 14 may be configured to generate motion and/or orientation output signals conveying motion and/or orientation information of the hilt. Motion and/or orientation information of the hilt may characterize one or more motion and/or orientation of the hilt. Motion of the hilt may include one or more of movement of the hilt, change in position of the hilt, and/or other motion of the hilt at a time or over a period of time. In some implementations, motion of the hilt may include distance between display 12 and the hilt at a time or over a period of time. Orientation of the hilt may include one or more of yaw, pitch, and/or roll of the hilt, change in yaw, pitch, and/or roll of the hilt, and/or other orientation of hilt at a time or over a period of time.

In some implementations, motion and orientation sensor 14 may include an inertial measurement unit and/or other motion and orientation sensors. An inertial measurement unit may include one or more of accelerometers, gyroscopes, magnetometers, and/or other motion and orientation sensors. An inertial measurement unit may include one or more of 3-DOF inertial measurement units, 6-DOF inertial measurement units, 9-DOF inertial measurement units, and/or other inertial measurement units. In some implementations, motion and orientation sensor 14 may include one or more distance sensors, such as infrared distance sensors, Lidar, ultrasonic distance sensors, and/or other distance sensors.

Figure 3A:
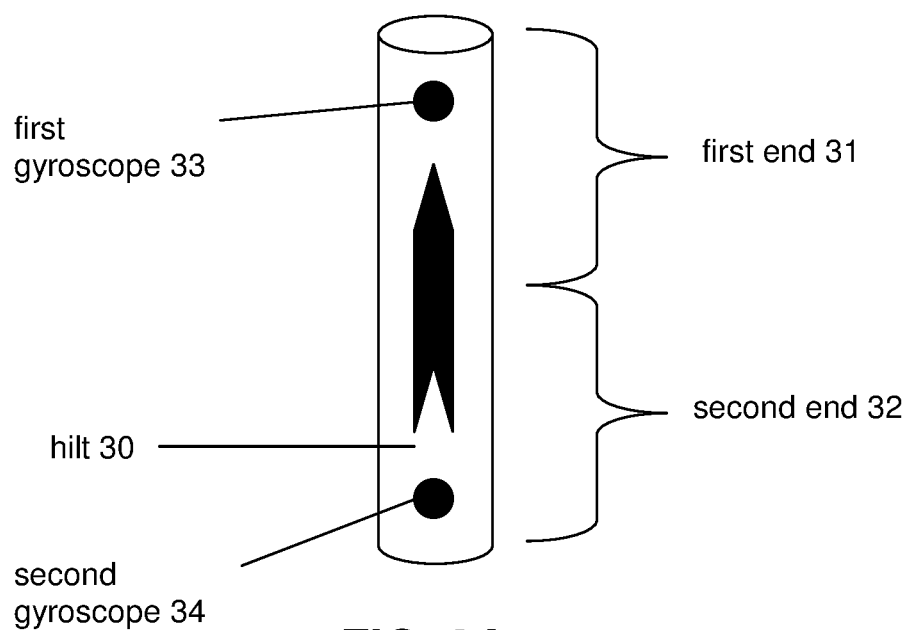
FIG. 3A illustrates an example of a hilt.

Gyroscope 15 may be carried by the hilt. In some implementations, gyroscope 15 may include a first gyroscope carried in a first portion of the hilt and a second gyroscope carried in a second portion of the hilt. The first portion and the second portion may be located in different ends of the hilt. For example, FIG. 3A illustrates hilt 30 in a form of a cylinder. Hilt 30 includes first end 31 and second end 32. Hilt 30 includes a chevron marking, which points toward the end of first end 31. Hilt 30 includes first gyroscope 33 located in first end 31, and second gyroscope 34 located in second end 32. Other forms of hilt and other arrangements of gyroscopes carried by the hilt are contemplated.

Figure 3B:
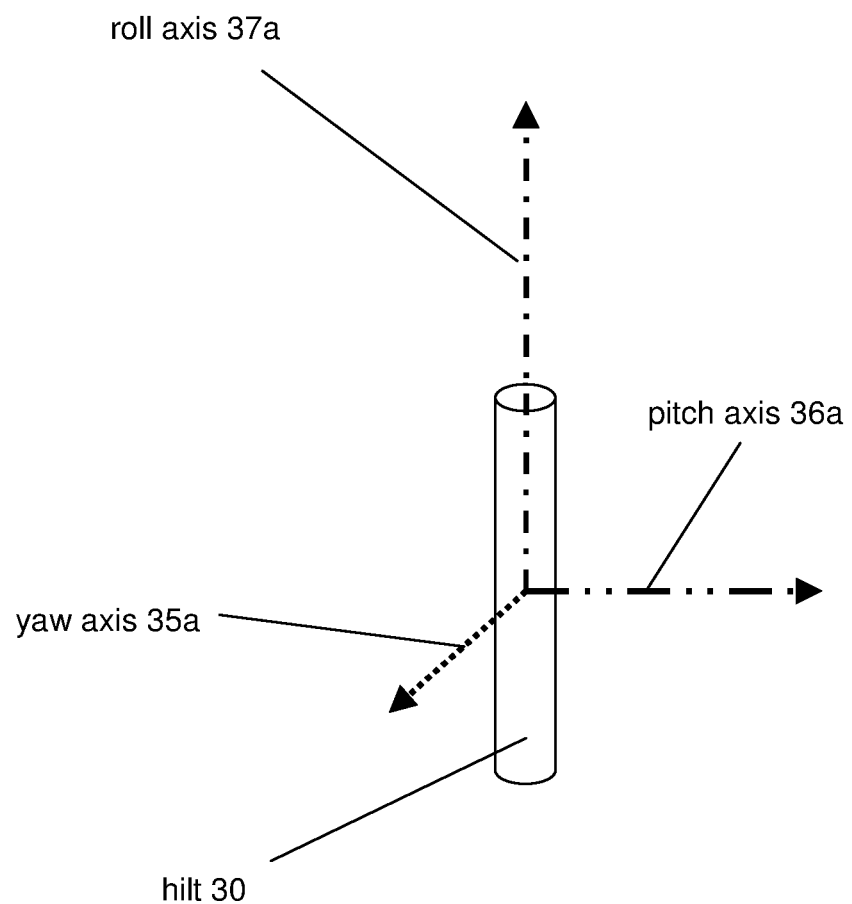
FIG. 3B illustrates examples of rotational axes of a hilt.

The hilt may have different rotational axes. For example, FIG. 3B illustrates three rotational axes on hilt 30. Hilt 30 includes a normal axis (yaw axis 35a) that is perpendicular to the plane formed by other two axes of hilt 30. Hilt 30 includes a lateral axis (pitch axis 36a) that runs along the lateral midline of hilt 30. Hilt 30 includes a longitudinal axis (roll axis 37a) that runs along the vertical midline of hilt 30. FIGS. 3C-3E illustrate examples of rotations of hilt 30 around axes shown in FIG. 3B. FIG. 3C illustrates an example of rotation around yaw axis 35a (yaw rotation 35b). FIG. 3D illustrates an example of rotation around pitch axis 36a (pitch rotation 36b). FIG. 3E illustrates an example of rotation around roll axis 37a (roll rotation 37b).

In some implementations, a landmark may be carried by the hilt. The landmark may indicate a reference point for the hilt that facilitates determination of a position and/or an orientation of the virtual blade. In some implementations, the landmark may include an augmented reality marker, a light emitting diode, the entire shape of the hilt, one or more parts of the hilt, and/or other landmarks. An augmented reality marker may be two-dimensional or three-dimensional. As a non-limiting example, an augmented reality marker may include one or more of a sticker, a label, a barcode, a quick response (QR) code, and/or other augmented reality markers. In some implementations, a hilt may include multiples types of landmarks. In some implementations, a landmark may be carried by the hilt as described in U.S. patent application Ser. No. 15/001,160, entitled "SYSTEMS AND METHODS FOR AUGMENTING AN APPEARANCE OF A HILT TO SIMULATE A BLADED WEAPON," filed Jan. 19, 2016, the foregoing being incorporated herein by reference in its entirety. Other types of landmarks are contemplated.

Figure 4A:
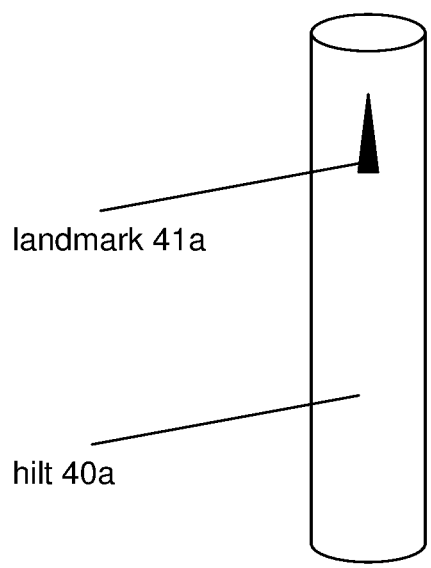
FIGS. 4A-4G illustrate examples of landmarks on hilts.
Figure 4B:
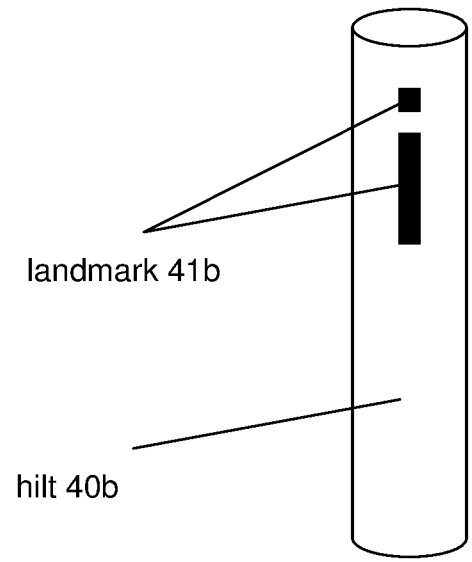
Figure 4C:
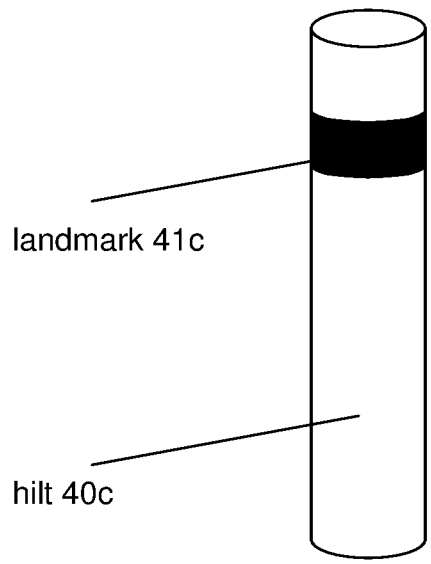
Figure 4D:
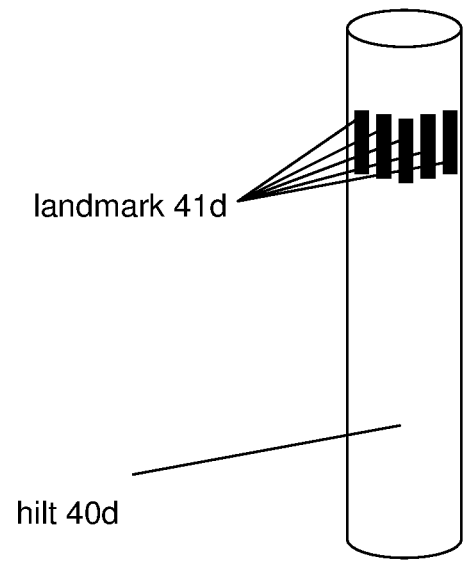
Figures 4E, 4F, 4G:
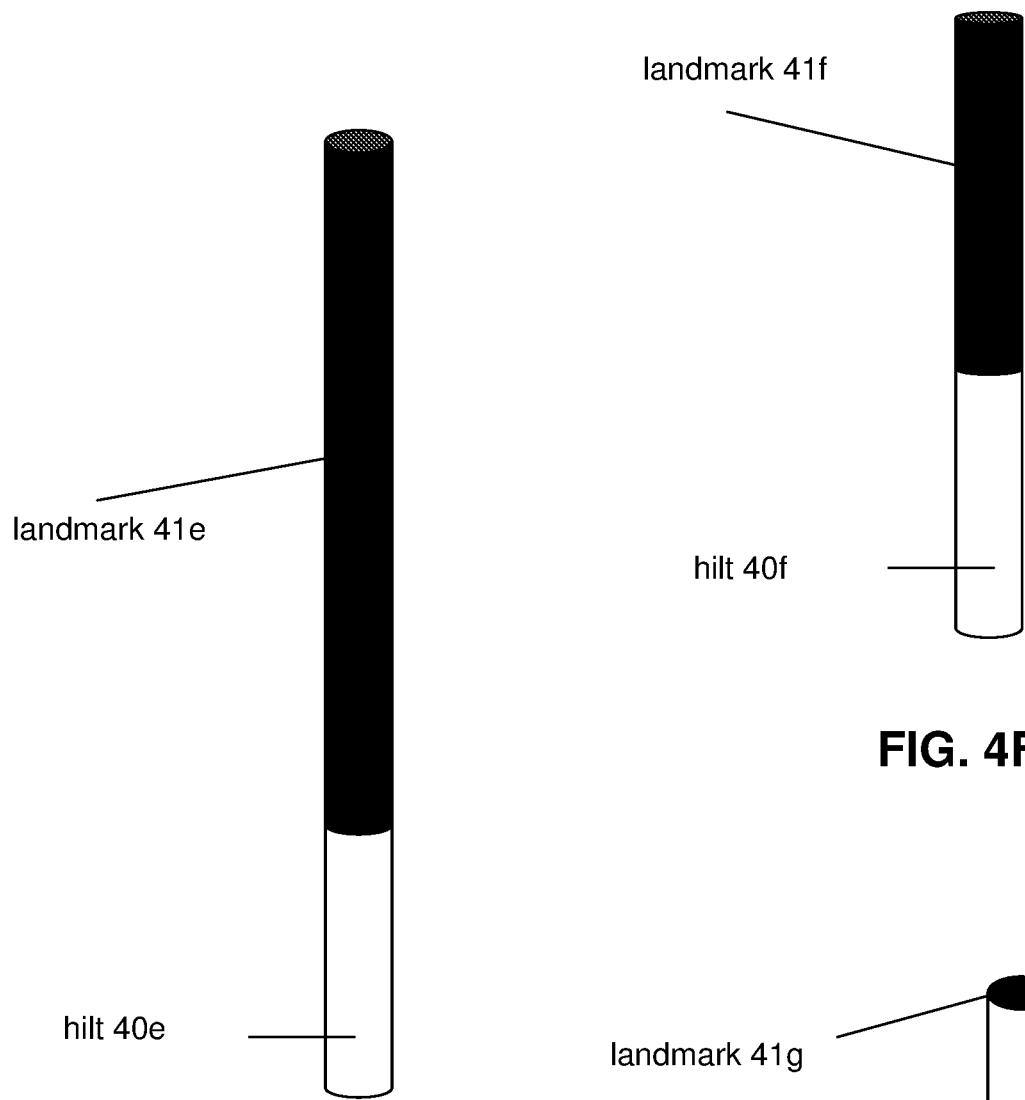

FIGS. 4A-4G provide non-limiting examples of landmarks 41 on hilts 40. In FIG. 4A, hilt 40a includes landmark 41a, and landmark 41a is triangular in shape. In FIG. 4B, hilt 40b includes landmark 41b, and landmark 41b looks like an upside-down exclamation mark. In FIG. 4C, hilt 40c includes landmark 41c, and landmark 41c is a rectangular band running around hilt 40c. In FIG. 4D, hilt 40d includes landmark 41d, and landmark 41d looks like long rectangles running around hilt 40d. In FIG. 4E, hilt 40e includes landmark 41e, and landmark 41e is a cylindrical blade attached to hilt 40e. In FIG. 4F, hilt 40f includes landmark 41f, and landmark 41f is a short cylindrical blade attached to hilt 40f. In FIG. 4G, hilt 40g includes landmark 41g, and landmark 41g is a rounded diffuser attached to hilt 40g. Landmarks in FIGS. 4A-4G may include one or more light emitting diodes and/or other lighting elements. Other shapes and configurations of landmarks are contemplated.

In some implementations, a hilt may include multiples types of landmarks. For example, hilt 40c may include landmark 41c (shown in FIG. 4C) on the front and landmark 41d (shown in FIG. 4D) on the back. Other combinations of landmarks are contemplated.

Electronic storage 16 may include electronic storage media that electronically stores information. Electronic storage 16 may store software algorithms, information determined by processor 11, information received remotely, and/or other information that enables system 10 to function properly. For example, electronic storage 16 may store visual information (as discussed elsewhere herein), information relating to virtual blades of virtual weapons, information relating to operation of gyroscope 15, and/or other information.

Processor 11 may be configured to provide information processing capabilities in system 10. As such, processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. Processor 11 may be configured to execute one or more computer program components. The computer program components may include one or more of position and orientation component 20, blade effects component 21, overlay component 22, display component 23, gyroscope control component 24, and/or other components.

Position and orientation component 20 may be configured to determine a position and/or an orientation of a virtual blade of the virtual weapon based on the visual output signals and/or the motion and/or orientation output signals. When the hilt is within the field of view of image sensor 13, position and orientation component 20 may be configured to determine a position and/or an orientation of the virtual blade based on the visual output signals conveying visual information within the field of view of image sensor 13.

Position and orientation component 20 may detect a hilt based on the visual output signals. Position and orientation component 20 may determine a position and/or an orientation of the hilt. Position and orientation component 20 may include or retrieve information (for example, a database, etc.) that matches a detected hilt to a position and/or an orientation of a virtual blade. For example, position and orientation component 20 may determine a position of a virtual blade based on the position of the hilt, and/or an orientation of the virtual blade based on the orientation of the hilt.

Figure 5A:
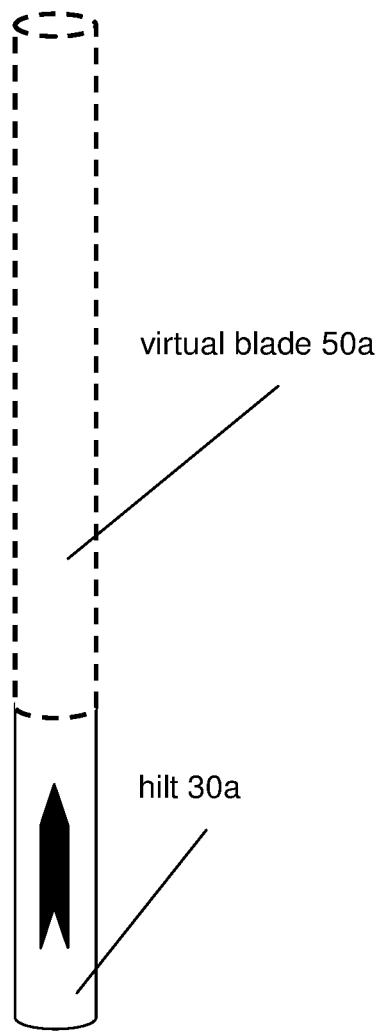
FIGS. 5A-6E illustrate examples of virtual blades augmenting the appearances of hilts.
Figure 5B:
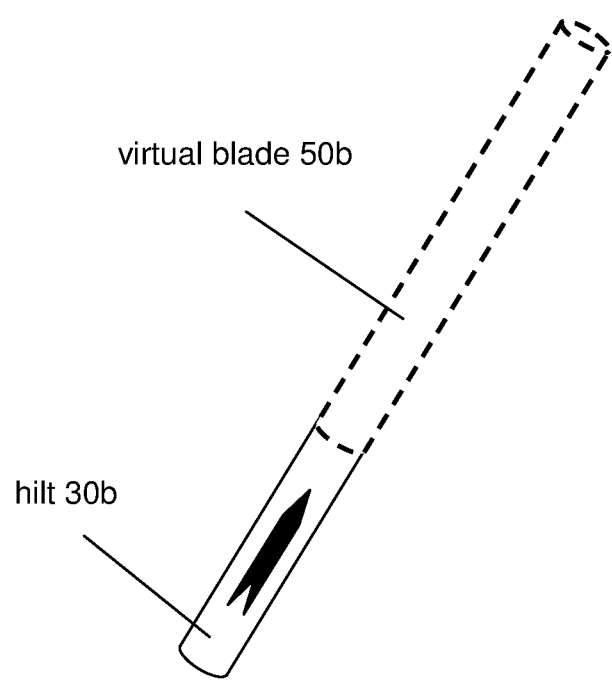

For example, in FIG. 5A, position and orientation component 20 may detect hilt 30a. Position and orientation component 20 may determine a position and/or an orientation of hilt 30a. Based on the position and/or the orientation of hilt 30a, position and orientation component 20 may determine a position and/or an orientation of virtual blade 50a for hilt 30a. As another example, in FIG. 5B, position and orientation component 20 may detect hilt 30b. Position and orientation component 20 may determine a position and/or an orientation of hilt 30b. Based on the position and/or the orientation of hilt 30b, position and orientation component 20 may determine a position and/or an orientation of virtual blade 50b for hilt 30b. The position of virtual blade 50a in FIG. 5A is closer to a user than the position of virtual blade 50b in FIG. 5B. The orientation of virtual blade 50a in FIG. 5A is vertical and the orientation of virtual blade 50b in FIG. 5B is tilted to the right.

In some implementations, position and orientation component 20 may be configured to determine the position and/or the orientation of the virtual blade based on a position and/or an orientation of a landmark. The landmark may be carried by the hilt. The landmark may indicate a reference point for the hilt that facilitates determination of a position and/or an orientation (yaw, pitch, and/or roll) of the virtual blade. Position and orientation component 20 may include or retrieve information (for example, a database, etc.) that matches a detected landmark to a position and/or an orientation of a virtual blade relative to the position and/or the orientation of the landmark. For example, position and orientation component 20 may determine the position of a virtual blade based on the position of a landmark, and/or the orientation of the virtual blade based on the orientation of the landmark. In some implementations, the position and/or the orientation of the virtual blade may be determined using systems and methods described in U.S. patent application Ser. No. 15/001,160, entitled "SYSTEMS AND METHODS FOR AUGMENTING AN APPEARANCE OF A HILT TO SIMULATE A BLADED WEAPON," filed Jan. 19, 2016, incorporated supra.

FIGS. 6A-6E illustrate non-limiting examples of positions and orientations of virtual blades 60 determined based on positions and orientations of landmarks 41. For example, position and orientation component 20 may detect landmark 41*a* (shown in FIG. 6A) and determine a position and/or an orientation of landmark 41*a*. Position and orientation component 20 may determine a position and/or an orientation of virtual blade 60*a* based on the position and/or the orientation of landmark 41*a*. Landmark 41*a* may indicate the position and/or orientation of virtual blade 60*a*. For example, the position of virtual blade 60*a* may be indicated by certain distances from landmark 41*a* (e.g., the right, left, top, and/or bottom positions of virtual blade 60*a* are determined by certain distances to the right, left, above, and/or below landmark 41*a*). The orientation of virtual blade 60*a* may be indicated by the orientation of landmark 41*a* (e.g., the pointed end of landmark 41*a* points toward virtual blade 60*a*).

As another example, position and orientation component 20 may detect landmark 41*b* (shown in FIG. 6B) and determine a position and/or an orientation of landmark 41*b*. Position and orientation component 20 may determine a position and/or an orientation of virtual blade 60*b* based on the position and/or the orientation of landmark 41*b*. Landmark 41*b* may indicate the position and/or orientation of virtual blade 60*b*. For example, the position of virtual blade 60*b* may be indicated by certain distances from landmark 41*b* (e.g., the right, left, top, and/or bottom positions of virtual blade 60*b* are determined by certain distances to the right, left, above, and/or below landmark 41*b*). The orientation of virtual blade 60*b* may be indicated by the orientation of landmark 41*b* (e.g., the dot-side of landmark 31*b* points toward one end of virtual blade 60*b*).

As another example, position and orientation component 20 may detect both landmark 41*c* (shown in FIG. 4C) and landmark 41*d* (shown in FIG. 4D) on hilt 40*c* and determine positions and/or orientations of landmark 41*c* and landmark 41*d*. Position and orientation component 20 may determine a position and/or an orientation of virtual blade 60*c* (shown in FIG. 6C) based on the position(s) and/or the orientation(s) of landmark 41*c* and/or landmark 41*d*. Landmark 41*c* and landmark 41*d* may indicate the position and/or orientation of virtual blade 60*c*. For example, the position of virtual blade 60*c* may be indicated by certain distances from landmark 41*c* and/or landmark 41*d* (e.g., the right, left, top, and/or bottom positions of virtual blade 60*c* are determined by certain distances to the right, left, above, and/or below landmark 41*c* and/or landmark 41*d*). The orientation of virtual blade 60*c* may be indicated by the orientation of landmark 41*c* and/or landmark 41*d* (e.g., the end of hilt 40*c* close to landmark 41*c* and/or landmark 41*d* is close to the start of virtual blade 60*c*, the front of virtual blade 60*c* is indicated by landmark 41*c*, and the back of virtual blade 60*c* is indicated by landmark 41*d*).

As another example, position and orientation component 20 may detect landmark 41*e* (shown in FIG. 4E) and determine a position and/or an orientation of landmark 41*e*. Position and orientation component 20 may determine a position and/or an orientation of virtual blade 60*e* (shown in FIG. 6D) based on the position and/or the orientation of landmark 41*e*. Landmark 41*e* may indicate the position and/or orientation of virtual blade 60*e*. For example, the position of virtual blade 60*e* may be indicated by certain distances from landmark 41*e* (e.g., the right, left, top, and/or bottom positions of virtual blade 60*b* are determined by certain the right, left, above, and/or bottom positions of landmark 41*e*). The orientation of virtual blade 60*e* may be indicated by the orientation of landmark 41*e* (e.g., the orientation of landmark 41*e* is the orientation of virtual blade 60*e*).

When the hilt is not within the field of view of image sensor 13, position and orientation component 20 may be configured to determine the position and/or the orientation of the virtual blade based on the motion and/or orientation output signals. Position and orientation component 20 may determine changes in position and/or orientation of the hilt based on the motion and/or orientation output signals. Position and orientation component 20 may determine the position and/or the orientation of the hilt based on the changes in the position and/or the orientation of the hilt. In some implementations, position and orientation component 20 may determine the position and/or the orientation of the hilt with respect to display 12 based on systems and methods described in U.S. patent application Ser. No. 15/001,160, entitled "SYSTEMS AND METHODS FOR AUGMENTING AN APPEARANCE OF A HILT TO SIMULATE A BLADED WEAPON," filed Jan. 19, 2016, incorporated supra.

In some implementations, position and orientation component 20 may be configured to determine a position and/or an orientation of a virtual blade based on the visual output signals and based on the motion and/or orientation output signals. For example, position and orientation component 20 may be configured to determine a position and/or an orientation of the virtual blade based on the visual output signals, and to adjust the position and/or the orientation of the virtual blade based on the motion and/or orientation output signals. Such a determination of the position and/or the orientation of a virtual blade may increase the accuracy of the position and/or the orientation of the virtual blade.

In some implementations, position and orientation component 20 may be configured to determine a position and/or an orientation of the virtual blade based on a previously determined position and/or a previously determined orientation of the virtual blade, and based on the motion and/or orientation output. For example, position and orientation component 20 may have determined a position and/or an orientation of the virtual blade, and may then determine a new position and/or a new orientation of the virtual blade based on the motion and/or orientation output signals. Such a determination of the new position and/or the new orientation of a virtual blade may allow position and orientation component 20 to avoid any latency arising from determining a position and/or an orientation of a virtual blade based on the visual output signals.

In some implementations, position and orientation component 20 may be configured to determine changes in a position and/or an orientation of a virtual blade. Changes in a position and/or an orientation of a virtual blade may include information regarding changes in a position and/or an orientation of a virtual blade at a time, over a period of time, at a location, or over a range of locations. For example, changes in a position and/or an orientation of a virtual blade may include one or more information regarding change in position, direction of position change, speed of position change, acceleration of position change, change in orientation, direction of orientation change, speed of orientation change, acceleration of orientation change, and/or other information regarding changes in a position and/or an orientation of the virtual blade.

Position and orientation component 20 may determine changes in a position and/or an orientation of a virtual blade based on the visual output signals and/or the motion and orientation signals. For example, when the hilt is within the field of view of image sensor 13, position and orientation component 20 may determine changes in a position and/or an orientation of a virtual blade based on the visual output signals. As another example, when the hilt is not within the field of view of image sensor 13, position and orientation component 20 may determine changes in a position and/or an orientation of the hilt based on the motion and/or orientation output signals.

In some implementations, position and orientation component 20 may determine changes in a position and/or an orientation of a virtual blade based on the visual output signals and based on the motion and/or orientation output signals. In some implementations, position and orientation component 20 may determine changes in a position and/or an orientation of the virtual blade based on a previously determined position and/or a previously determined orientation of the virtual blade, and based on the motion and/or orientation output.

Blade effects component 21 may be configured to select a virtual blade. A virtual blade may be a blade of a real weapon, such as a broadsword, an axe, or a katana, or a fictional weapon, such as a lightsaber. In some implementations, blade effects component 21 may be configured to select the virtual blade based on a user input received through an input device. An input device may refer to a device that allows a user to input information. For example, an input device may include a key entry device, a touch entry device, an imaging device, a sound device, and/or other input devices. A user input may refer to one or more information provided by a user through an input device.

A key entry device may include a device that allows a user to provide one or more user inputs by typing one or more of characters, numbers, and/or other symbols. A key entry device may include a separate device or a part of another device. For example, a key entry device may include a keyboard/button coupled to processor 11. As another example, a key entry device may include a mobile device coupled to processor 11. A user may provide one or more user inputs by typing one or more information. For example, a user may provide one or more user inputs by typing one or more of a type, shape, size, color, and/or other information about the virtual blade.

A touch entry device may include a device that allows a user to provide user inputs by touching a user interface of the touch entry device. A touch entry device may include a separate device or a part of another device. For example, a touch entry device may include a touch screen coupled to processor 11. As another example, a touch entry device may include a mobile device coupled to processor 11. A user may provide one or more user inputs by touching one or more portions of the touch entry device corresponding to one or more information. For example, a user may provide one or more user inputs by touching one or more portions of the touch entry device corresponding to one or more of a type, shape, size, color, and/or other information about the virtual blade.

An imaging device may include a device that allows a user to provide user inputs by using an image sensor of the imaging device. An imaging device may include a separate device or a part of another device. For example, an imaging device may include an image sensor coupled to processor 11. As a non-limiting example, an imaging device may include image sensor 13. As another example, an imaging device may include a mobile device coupled to processor 11. A user may provide one or more user inputs by directing the field of view of the imaging device to objects that include information. For example, a user may provide one or more user inputs by directing the field of view of the imaging device to a landmark, an augmented reality marker, and/or other objects that include one or more of a type, shape, size, color, and/or other information about the virtual blade.

A sound device may include a device that allows a user to provide user inputs through voice and/or sounds. A sound device may include a separate device or part of another device. For example, a sound device may include a microphone coupled to processor 11. As another example, a sound device may include a mobile device coupled to processor 11. A user may provide one or more user input by speaking one or more information. For example, a user may provide one or more user inputs by speaking one or more of a type, shape, size, color, and/or other information about the virtual blade.

In some implementations, blade effects component 21 may be configured to select the virtual blade based on a landmark. Blade effects component 21 may include or retrieve information (for example, a database, etc.) that matches a landmark to a particular virtual blade. In some implementations, the virtual blade may be selected as described in U.S. patent application Ser. No. 15/001,160, entitled "SYSTEMS AND METHODS FOR AUGMENTING AN APPEARANCE OF A HILT TO SIMULATE A BLADED WEAPON," filed Jan. 19, 2016, incorporated supra.

Figure 6A:
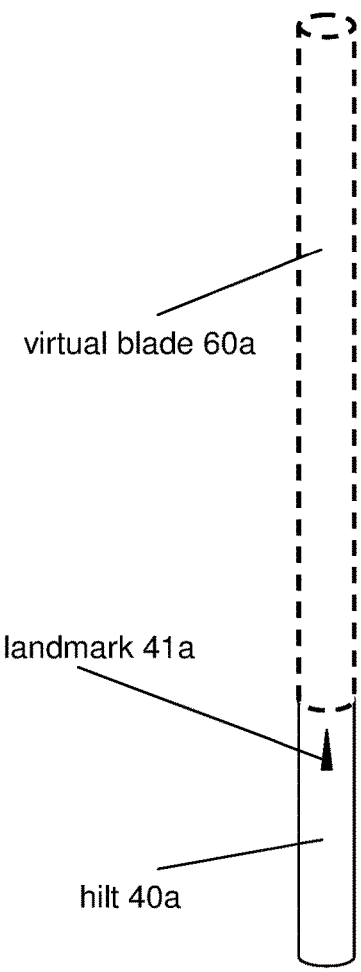
Figure 6B:
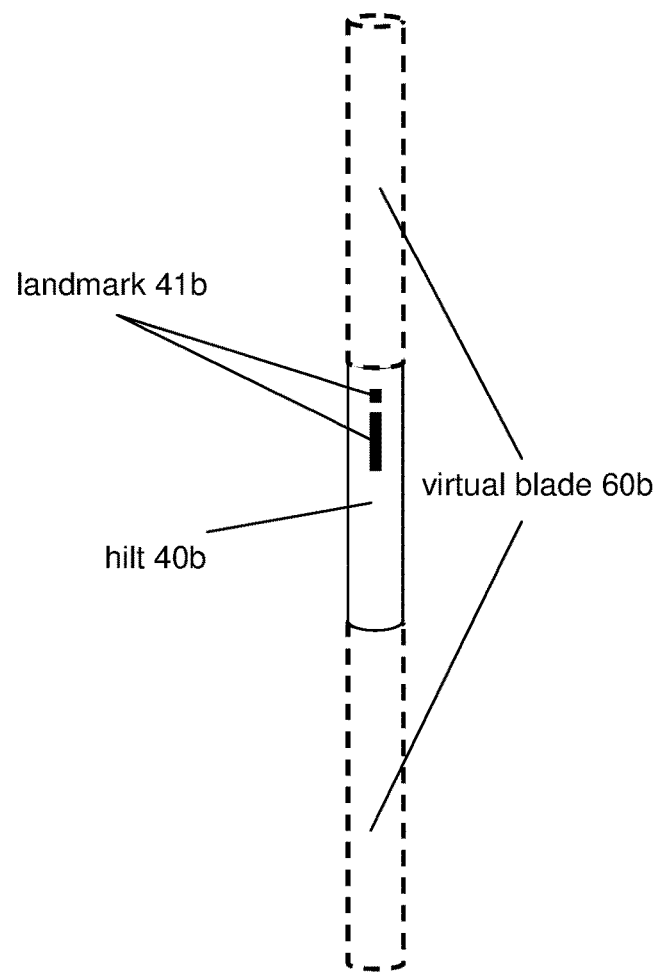

FIGS. 6A-6E illustrate non-limiting examples of virtual blades selected by blade effects component 21 based on landmarks 41. In FIG. 6A, blade effects component 21 may select virtual blade 60a based on landmark 41a. Virtual blade 60a is cylindrical in shape and appears to extend outwardly from top of hilt 40a. In FIG. 6B, blade effects component 21 may select virtual blade 60b based on landmark 41b. Virtual blade 60b is cylindrical in shape and appears to extend outwardly from top and bottom of hilt 40b.

In FIG. 6C, blade effects component 21 may select virtual blade 60c based on landmark 41c and landmark 41d. Virtual blade 60c is curved and appears to extend outwardly from top of hilt 40c. Virtual blade 60c curves towards the back of hilt 40c, with landmark 41d indicating the back of hilt 40c and landmark 41c indicating the front of hilt 40c.

Figure 6E:
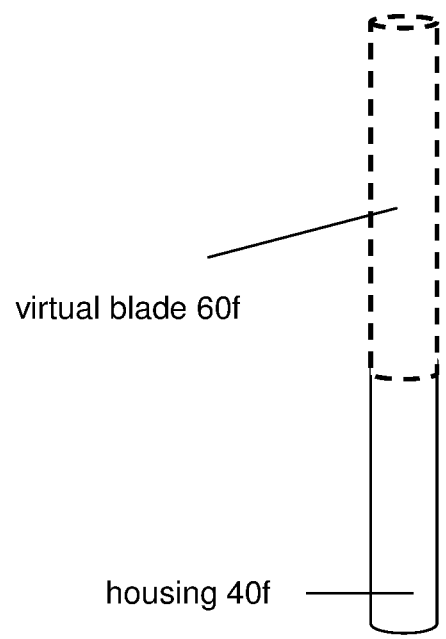

In FIG. 6D, blade effects component 21 may select virtual blade 60e based on landmark 41e (shown in FIG. 4E). Virtual blade 60e is cylindrical in shape appears to extend outwardly from top of hilt 40e. When virtual blade 60e appears on top of hilt 40e, landmark 41e may not be visible. In FIG. 6E, blade effects component 21 may select virtual blade 60f based on landmark 41f (shown in FIG. 4F). Virtual blade 60f is cylindrical in shape appears to extend outwardly from top of hilt 40f. When virtual blade 60f appears on top of hilt 40f, landmark 41f may not be visible.

In some implementations, blade effects component 21 may select virtual blade 60e (shown in FIG. 6D) based on landmark 41f (shown in FIG. 4F) or landmark 41g (shown in FIG. 4G). When virtual blade 60e appears on top of hilt 40f, landmark 41f may not be visible. Virtual blade 60e may be longer than landmark 41f. When virtual blade 60e appears on top of hilt 40g, landmark 41g may not be visible. Virtual blade 60e may be larger than landmark 41g. Other selections of blades based on landmarks are contemplated.

Overlay component 22 may be configured to determine an overlay image. The overlay image may include a virtual blade of a virtual weapon determined by blade effects component 21. The virtual blade may be placed within the overlay image according to the position and/or the orientation of the virtual blade. The position and/or the orientation of the virtual blade may change how the virtual blade appears within the overlay image. For example, the position and/or the orientation of the virtual blade may change one or more of the position, the size, the shape, the tilt, the rotation, and/or other appearances of the virtual blade.

Display component 23 may be configured to effectuate displaying of an overlay image on display 12. The displaying may be effectuated so that the virtual blade appears to be attached to the hilt. In some implementations, display component 23 may be configured to effectuate displaying of an overlay image within one or more of an image, a video, and/or other visual information based on the visual output signals generated by image sensor 13.

In some implementations, display component 23 may be configured to effectuate displaying of an overlay image on display 12, which allows light to be passed through display 12 in portions in which the overlay image does not contain the virtual blade. For example, display 12 may include one or more of an optical head-mounted display and a user of display 12 may see light from the real world as well as the overlay image. In some implementations, display component 23 may be configured to change the transparency of one or more portions of display 12. For example, display component 23 may change the transparency of one or more portions of display 12 corresponding to the virtual blade to block light from the real world passing through display 12.

Gyroscope control component 24 may be configured to determine controls for gyroscope 15 based on the position and/or the orientation of the virtual blade. The controls for gyroscope 15 may determine one or more of speed and/or direction of rotation of gyroscope 15 around one or more axis at a time, over a period of time, at a location, or over a range of locations. For example, the controls for gyroscope 15 may determine one or more of direction and/or speed of yaw rotation, roll rotation, and/or pitch rotation of gyroscope 15.

For example, FIGS. 5A and 5B illustrate examples of virtual blade 50 in different positions and orientations. Comparing FIGS. 5A and 5B, virtual blade 50a is closer to the user than virtual blade 50b. Virtual blade 50a is oriented vertically while virtual blade 50b is tilted to the right. Gyroscope control component 24 may determine different controls for virtual blade 50a and virtual blade 50b. As non-limiting examples, gyroscope control component 24 may determine low speed(s) of rotation around one or more axes for gyroscope 15 based on the position and/or orientation of virtual blade 50a, and high speed(s) of rotation around one or more axes for gyroscope 15 based on the position and/or orientation of virtual blade 50b. Low speed(s) of rotation by gyroscope 15 may provide low resistance to changing the orientation of hilt 30a. High speed(s) of rotation by gyroscope 15 may provide high resistance to changing the orientation of hilt 30b.

The resistance to changing the orientation of hilt 30 may simulate the feel of moving a virtual weapon. For example, for hilt 30a, low resistance to changing the orientation of hilt 30a may simulate the feel of moving a virtual lightsaber held close and upright (e.g., to simulate gravity on the virtual blade). As another example, for hilt 30b, high resistance to changing the orientation of hilt 30b may simulate the feel of moving a virtual lightsaber held far and tilted (e.g., to simulate gravity on the virtual blade).

In some implementations, gyroscope control component 24 may be configured to determine the controls for gyroscope 15 based on changes in a position and/or an orientation of a virtual blade. Changes in a position and/or an orientation of a virtual blade may include information regarding changes in a position and/or an orientation of a virtual blade at a time, over a period of time, at a location, or over a range of locations. For example, changes in a position and/or an orientation of a virtual blade may include one or more information regarding change in position, direction of position change, speed of position change, acceleration of position change, change in orientation, direction of orientation change, speed of orientation change, acceleration of orientation change, and/or other information regarding changes in a position and/or an orientation of the virtual blade.

Gyroscope control component 24 may determine one or more of speed and/or direction of rotation of gyroscope 15 around one or more axis based on the changes in the position and/or the orientation of the virtual blade. For example, the position and orientation of virtual blade 50 may change from the position and orientation shown in FIG. 5A to the position and orientation shown in and FIG. 5B. Based on the changes in the position and the orientation of virtual blade 50, gyroscope control component 24 may increase the speed of rotation around one or more axes by gyroscope 15.

Figure 7A:
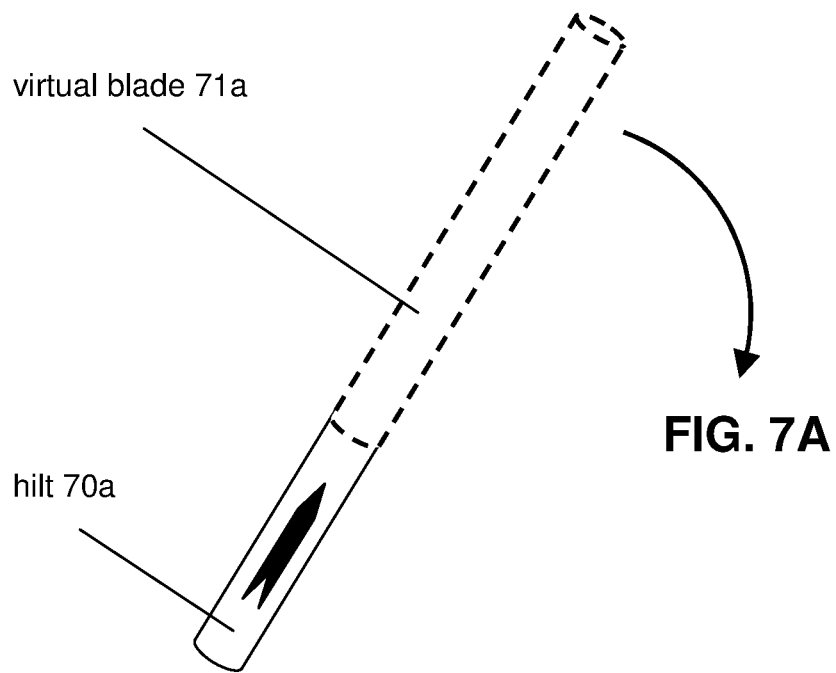
FIGS. 7A-7B illustrate examples of virtual blade rotations.
Figure 7B:
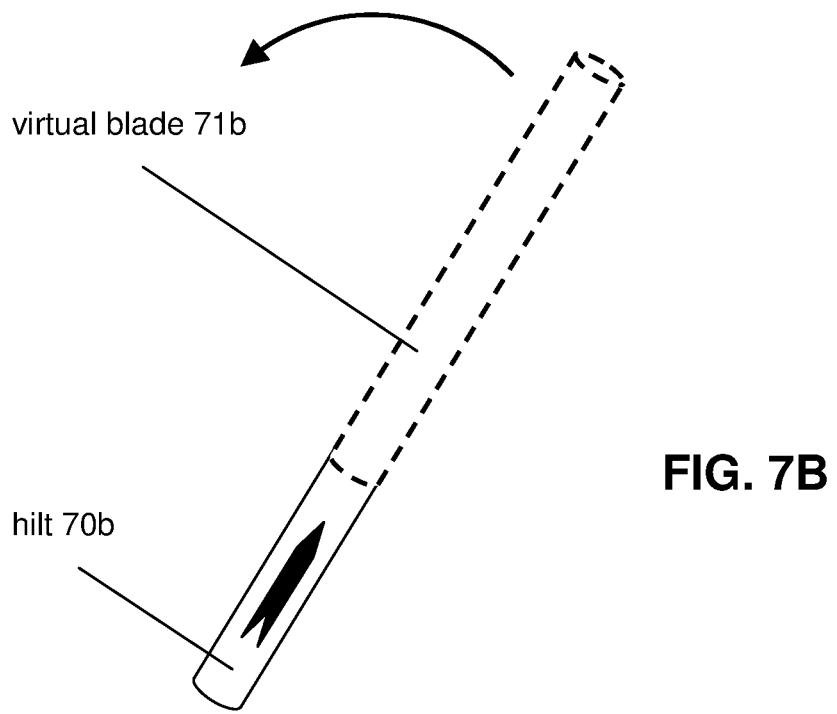

As another example, FIGS. 7A and 7B illustrate examples of rotations of virtual blade 71. In FIG. 7A, virtual blade 71a, attached to hilt 70a, may be rotated downwards. Based on virtual blade 71a downward rotation, gyroscope control component 24 may determine low speed(s) of rotation around one or more axes for gyroscope 15. Low speed(s) of rotation by gyroscope 15 may provide low resistance to changing the orientation of hilt 70a downwards and may simulate the feel of moving the virtual weapon downwards (e.g., to simulate downward movement assisted by gravity).

In FIG. 7B, virtual blade 71b, attached to hilt 70b, may be rotated upwards and then downwards. When virtual blade 71b is being rotated upwards, gyroscope control component 24 may determine high speed(s) of rotation around one or more axes for gyroscope 15. High speed(s) of rotation by gyroscope 15 may provide high resistance to changing the orientation of hilt 70b upwards and may simulate the feel of moving the virtual weapon upwards (e.g., to simulate upward movement opposed by gravity).

When virtual blade 71b reaches the top and begins to rotate downwards, gyroscope control component 24 may determine low speed(s) of rotation around one or more axes for gyroscope 15. Low speed(s) of rotation by gyroscope 15 may provide low resistance to changing the orientation of hilt 70b downwards and may simulate the feel of moving the virtual weapon downwards (e.g., to simulate downward movement assisted by gravity).

Figures 8A, 8B:
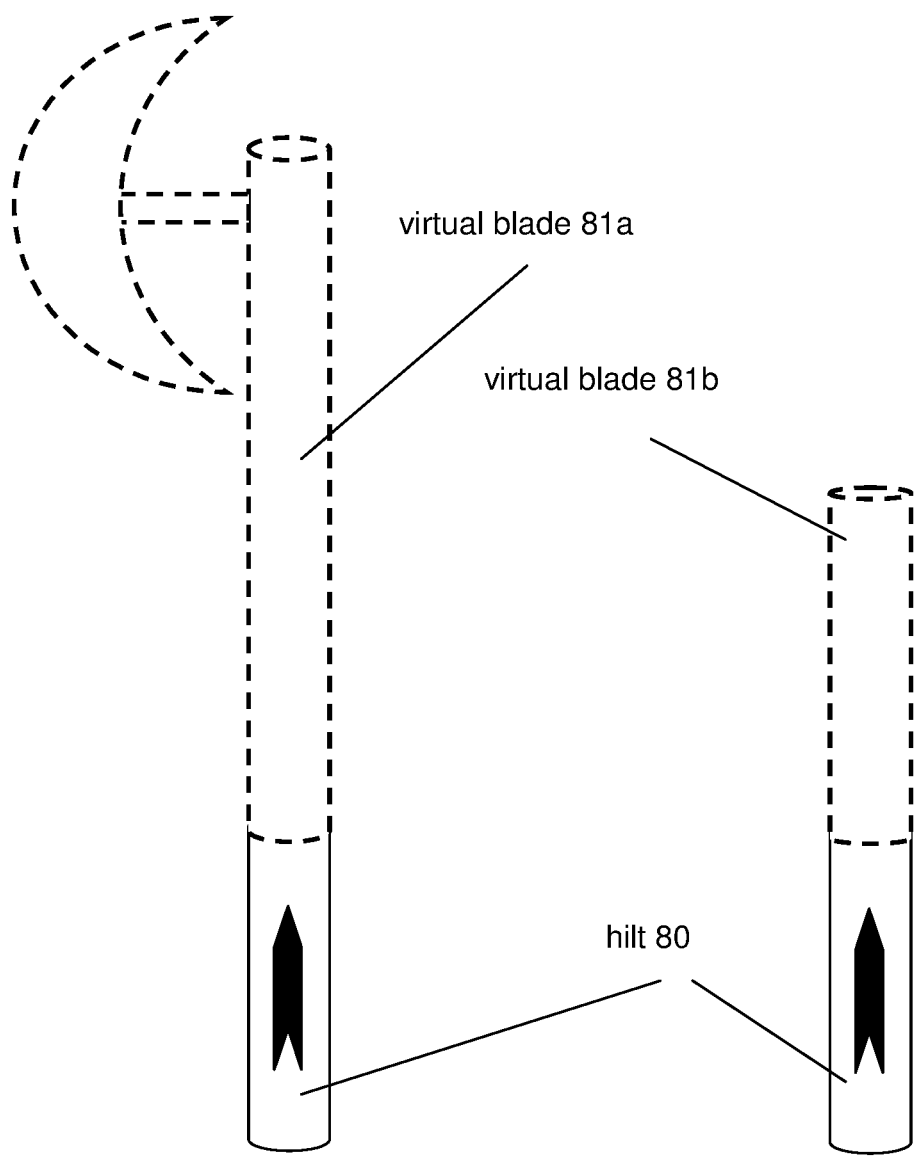
FIGS. 8A-8B illustrate examples of changing virtual blades.

In some implementations, system 10 may be configured to determine the controls for gyroscope 15 to simulate changes in a virtual blade. Blade effects component 21 may be configured to change the type, the shape and/or the size of the virtual blade. For example, as shown in FIGS. 8A and 8B, blade effects component 21 may change virtual blade 81 for hilt 80. In FIG. 8A, virtual blade 81a appears as a blade of an axe. In FIG. 8B, virtual blade 81b appears as a short cylinder, simulating the top portion of the axe blade having broken off. Other types of changes in a virtual blade are contemplated.

Gyroscope control component 24 may be configured to determine the controls for gyroscope 15 based on the changed type, the changed shape and/or the changed size of the virtual blade. For example, in FIG. 8A, gyroscope control component 24 may determine high speed(s) of rotation around one or more axes for gyroscope 15. High speed(s) of rotation by gyroscope 15 may provide high resistance to changing the orientation of hilt 80 and may simulate the feel of moving a heavy virtual weapon (e.g., to simulate heavy blade of an axe). In FIG. 8B, gyroscope control component 24 may determine low speed(s) of rotation around one or more axes for gyroscope 15. Low speed(s) of rotation by gyroscope 15 may provide low resistance to changing the orientation of hilt 80 and may simulate the feel of moving a light virtual weapon (e.g., to simulate heavy blade of an axe being broken off).

In some implementations, system 10 may be configured to determine the controls for gyroscope 15 to simulate interactions between the virtual blade and an object. An object may be a physical object or a virtual object. A physical object may refer to an object in the real world. A physical object may include a static object (e.g., a still door, a wall, a rock, etc.) or a dynamic object (e.g., a moving door, a moving target, etc.). A virtual object may refer to an object generated by a computing device, such as processor 11. A virtual object may include a static object (e.g., a virtual barrier, a still virtual blade of another hilt, etc.) or a dynamic object (e.g., a moving virtual blade of another hilt, a virtual blaster fire, a virtual moving robot, etc.).

Position and orientation component 20 may be configured to detect an object based on the visual output signals. Position and orientation component 20 may be configured to determine when the virtual blade touches the object. Gyroscope control component 24 may be configured to determine the controls for gyroscope 15 based on the virtual blade touching the object.

Position and orientation component 20 may determine a position and/or an orientation of the object based on the visual output signals conveying visual information within the field of view of image sensor 13. Position and orientation component 20 may determine when the virtual blade touches the object based on the position and/or the orientation of the virtual blade, and the position and/or the orientation of the object. Other implementations to determine when the virtual blade touches the objects are contemplated.

Figure 9:
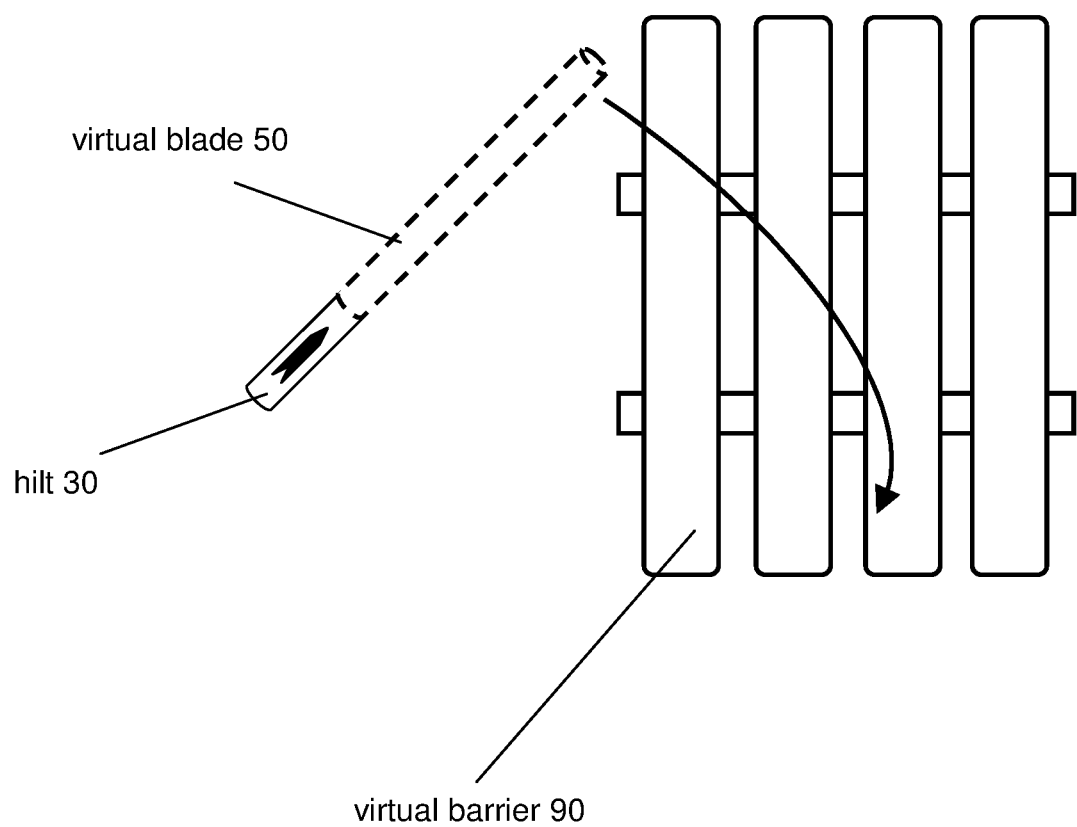
FIG. 9 illustrates an example of a virtual blade touching a virtual barrier.

Gyroscope control component 24 may determine controls for gyroscope 15 based on the virtual blade touching the object. Gyroscope control component 24 may determine one or more of speed and/or direction of rotation of gyroscope 15 around one or more axis based on the virtual blade touching the object. For example, FIG. 9 shows virtual blade touching virtual barrier 90. When virtual blade 50 is touching virtual barrier 90, gyroscope control component 24 may determine high speed(s) of rotation around one or more axes for gyroscope 15. High speed(s) of rotation by gyroscope 15 may provide high resistance to changing the orientation of hilt 30 and may simulate the feel of moving a virtual weapon into an object (e.g., to simulate virtual blade 50 slicing into virtual barrier 90).

When virtual blade 50 is not touching virtual barrier 90 (e.g., before or after virtual blade 50 slices into virtual barrier 90, or when virtual blade 50 is in gaps in virtual barrier 90), gyroscope control component 24 may determine low speed(s) of rotation around one or more axes for gyroscope 15. Low speed(s) of rotation by gyroscope 15 may provide low resistance to changing the orientation of hilt 30 and may simulate the feel of moving a virtual weapon in the air.

Figure 10:
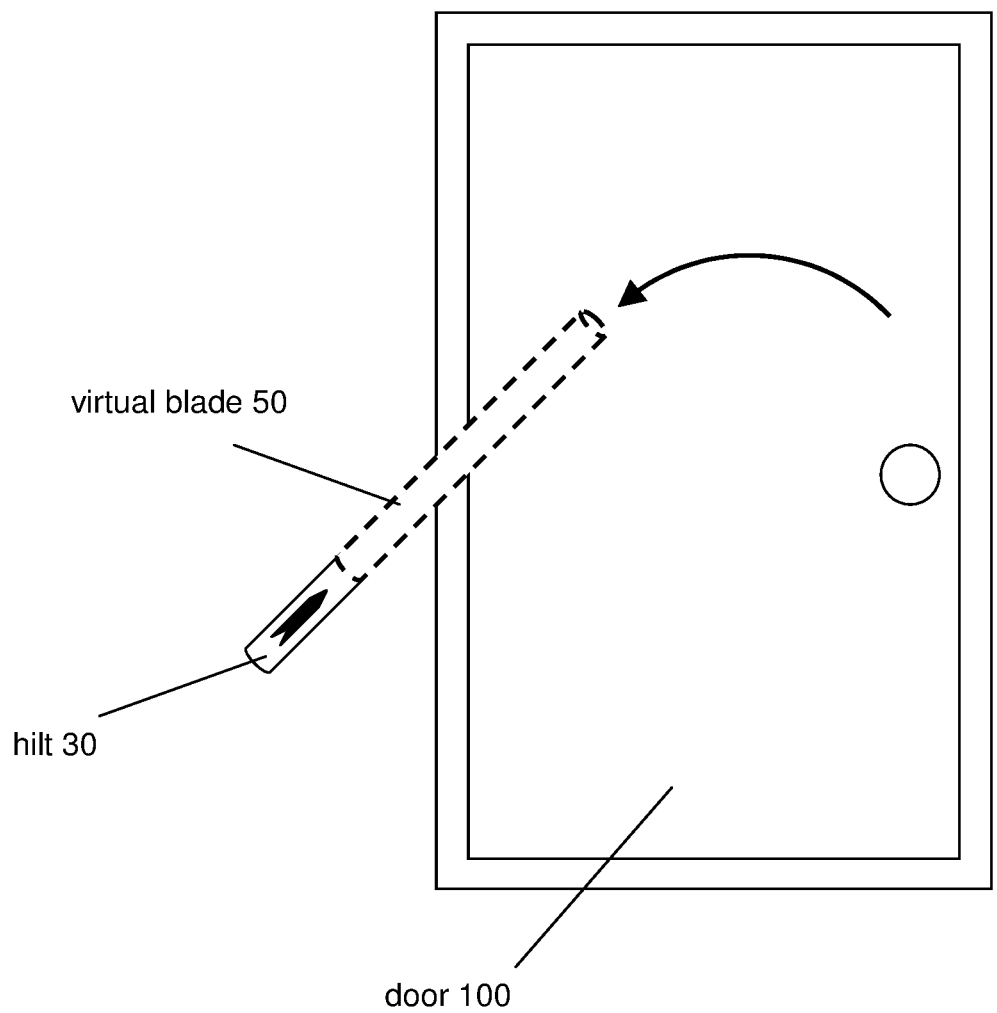
FIG. 10 illustrates an example of a virtual blade touching a door.

As another example, FIG. 10 shows virtual blade 50 touching door 100. In FIG. 10, virtual blade 50 is pushed into door 100 and moved in a circular shape. When virtual blade 50 touches door, gyroscope control component 24 may determine high speed(s) of rotation around one or more axes for gyroscope 15. High speed(s) of rotation by gyroscope 15 may provide high resistance to changing the orientation of hilt 30 and may simulate the feel of moving a virtual weapon into an object (e.g., to simulate virtual blade 50 slicing into door 100).

Gyroscope control component 24 may be configured to effectuate operation of gyroscope 15 in accordance with the controls for gyroscope 15. Gyroscope control component 24 may effectuate speed and/or direction of rotation of gyroscope 15 around one or more axis. Gyroscope 15 may be operated to provide resistance to changing the orientation of the hilt. The resistance to changing the orientation of the hilt may simulate the feel of moving the virtual weapon, as described above.

In some implementations, system 10 may include a speaker. Blade effects component 21 may be configured to effectuate operation of the speaker. The operation of the speaker may be effectuated in response to changes in the position and/or the orientation of the virtual blade based one or more of the visual output signals and/or the motion and/or orientation output signals. The speaker may be operated to provide one or more audio effects. An audio effect may refer to one or more information that may be observed audibly. An audio effect may be static or dynamic, and may be audibly observable at a time, over a period of time, at a location, or over a range of locations. An audio effect may include one or more of a sound, a music, a word, a sentence, and/or other audio effect.

For example, blade effects component 21 may have selected a blade of a lightsaber as the virtual blade for a hilt. When the virtual blade is motionless, blade effects component 21 may effectuate operation of the speaker to produce a buzzing/humming sound of a motionless lightsaber. When the virtual blade is moving, blade effects component 21 may effectuate operation of the speaker to produce a "wah" sound of a moving lightsaber. Blade effects component 21 may be configured to change the intensity and/or length of the sound based on the movement of the virtual blade.

In some implementations, blade effects component 21 may be configured to effectuate operation of the speaker based on the virtual blade touching an object. For example, in FIG. 9, blade effects component 21 may effectuate the operation of the speaker to produce a cutting sound when virtual blade 50 is pushed into virtual barrier 90. Other types of audio effects are contemplated.

In some implementations, system 10 may include a haptic generator. Blade effects component 21 may be configured to effectuate operation of the haptic generator in response to changes in the position and/or the orientation of the virtual blade based one or more of the visual output signals and/or the motion and/or orientation output signals. The haptic generator may be operated to provide one or more haptic effects. A haptic effect may refer to one or more information that may be observed haptically. A haptic effect may be static or dynamic, and may be haptically observable at a time, over a period of time, at a location, or over a range of locations. A haptic effect may include one or more of a vibration, a motion, a temperature, and/or other haptic effects.

For example, blade effects component 21 may have selected a blade of a lightsaber as the virtual blade for a hilt. Blade effects component 21 may effectuate operation of the haptic generator to produce a light vibration of a lightsaber. Blade effects component 21 may be configured to change the intensity and/or length of the vibration based on the movement of the virtual blade.

In some implementations, blade effects component 21 may be configured to effectuate operation of the haptic generator based on the virtual blade touching the object. For example, in FIG. 9, blade effects component 21 may effectuate the operation of the haptic generator to produce heat when virtual blade 50 is pushed into virtual barrier 90. Other types of haptic effects are contemplated.

Although processor 11, display 12, image sensor 13, motion and orientation sensor 14, gyroscope 15, and electronic storage 16 are shown to be connected to a bus 17 in FIG. 1, any communication medium may be used to facilitate interaction between any components of system 10. One or more components of system 10 may communicate with each other through hard-wired communication, wireless communication, or both. For example, processor 11 may wirelessly communicate with motion and orientation sensor 14. By way of non-limiting example, wireless communication may include one or more of radio communication, Bluetooth communication, Wi-Fi communication, cellular communication, infrared communication, or other wireless communication. Other types of communications are contemplated by the present disclosure.

Although processor 11 is shown in FIG. 1 as a single entity, this is for illustrative purposes only. In some implementations, processor 11 may comprise a plurality of processing units. These processing units may be physically located within the same device, or processor 11 may represent processing functionality of a plurality of devices operating in coordination.

Processor 11 may be configured to execute one or more of position and orientation component 20, blade effects component 21, overlay component 22, display component 23, gyroscope control component 24, and/or other components by software; hardware; firmware; some combination of software, hardware, and/or firmware; and/or other mechanisms for configuring processing capabilities on processor 11.

It should be appreciated that although position and orientation component 20, blade effects component 21, overlay component 22, display component 23, and gyroscope control component 24 are illustrated in FIG. 1 as being co-located within a single processing unit, in implementations in which processor 11 comprises multiple processing units, one or more of position and orientation component 20, blade effects component 21, overlay component 22, display component 23 and/or gyroscope control component 24 may be located remotely from the other computer program components.

The description of the functionality provided by the different computer program components 20, 21, 22, 23, and/or 24 described herein is for illustrative purposes, and is not intended to be limiting, as any of computer program components 20, 21, 22, 23, and/or 24 may provide more or less functionality than is described. For example, one or more of computer program components 20, 21, 22, 23, and/or 24 may be eliminated, and some or all of its functionality may be provided by other computer program components 20, 21, 22, 23, and/or 24. As another example, processor 11 may be configured to execute one or more additional computer program components that may perform some or all of the functionality attributed to one or more of computer program components 20, 21, 22, 23, and/or 24.

Although display 12 is depicted in FIG. 1 as a single element, this is not intended to be limiting. Display 12 may include one or more displays in one or more locations.

Although image sensor 13 is depicted in FIG. 1 as a single element, this is not intended to be limiting. Image sensor 13 may include one or more image sensors in one or more locations.

Although motion and orientation sensor 14 is depicted in FIG. 1 as single elements, this is not intended to be limiting. Motion and orientation sensor 14 may include one or more motion and orientation sensors in one or more locations.

Although gyroscope 15 is depicted in FIG. 1 as single elements, this is not intended to be limiting. Gyroscope 15 may include one or more gyroscopes in one or more locations.

The electronic storage media of electronic storage 16 may be provided integrally (i.e., substantially non-removable) with one or more components of system 10 and/or removable storage that is connectable to one or more components of system 10 via, for example, a port (e.g., a USB port, a Firewire port, etc.) or a drive (e.g., a disk drive, etc.). Electronic storage 16 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. Electronic storage 16 may be a separate component within system 10, or electronic storage 16 may be provided integrally with one or more other components of system 10 (e.g., processor 11). Although electronic storage 16 is shown in FIG. 1 as a single entity, this is for illustrative purposes only. In some implementations, electronic storage 16 may comprise a plurality of storage units. These storage units may be physically located within the same device, or electronic storage 16 may represent storage functionality of a plurality of devices operating in coordination.

FIG. 2 illustrates method 200 for simulating a feel of moving a virtual weapon. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operations of method 200 in response to instructions stored electronically on one or more electronic storage mediums. The one or more processing devices may include one or more devices configured through hardware, firmware, and/or software to be specifically designed for execution of one or more of the operations of method 200.

Referring to FIG. 2 and method 200, at operation 201, visual output signals conveying visual information within a field of view of an image sensor may be generated. Visual information may include one or more of an image, a video, and/or other visual information. In some implementations, operation 201 may be performed by one or more sensors the same as or similar to image sensor 13 (shown in FIG. 1 and described herein).

At operation 202, motion and/or orientation output signals conveying motion and/or orientation information of a hilt may be generated. In some implementations, operation 202 may be performed by one or more sensors the same as or similar to motion and orientation sensor 14 (shown in FIG. 1 and described herein).

At operation 203, a position and/or an orientation of a virtual blade of a virtual weapon may be determined based on the visual output signals and/or the motion and/or orientation output signals. In some implementations, operation 203 may be performed by a processor component the same as or similar to position and orientation component 20 (shown in FIG. 1 and described herein).

At operation 204, an overlay image comprising the virtual blade of the virtual weapon may be determined. The virtual blade may be placed within the overly image according to the position and/or the orientation of the virtual blade. In some implementations, operation 204 may be performed by a processor component the same as or similar to overlay component 22 (shown in FIG. 1 and described herein).

At operation 205, displaying of the overlay image on a display may be effectuated so that the virtual blade appear to be attached to the hilt. In some implementations, operation 205 may be performed by a processor component the same as or similar to display component 23 (shown in FIG. 1 and described herein).

At operation 206, controls for a gyroscope may be determined based on the position and/or the orientation of the virtual blade. In some implementations, operation 206 may be performed by a processor component the same as or similar to gyroscope control component 24 (shown in FIG. 1 and described herein).

At operation 207, operation of the gyroscope may be effectuated in accordance with the controls for the gyroscope to provide resistance to changing the orientation of the hilt. The resistance to changing the orientation of the hilt may simulate the feel of moving the virtual weapon. In some implementations, operation 207 may be performed by a processor component the same as or similar to gyroscope control component 24 (shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system to simulate a feel of using a virtual weapon, the system comprising:
a display configured to display an overlay image;
an image sensor configured to generate visual output signals conveying visual information within a field of view of the image sensor;
a hilt;
a motion and orientation sensor carried by the hilt, the motion and orientation sensor being configured to generate motion and/or orientation output signals conveying motion and/or orientation information of the hilt;
one or more gyroscopes carried by the hilt; and
one or more processors configured by machine readable instructions to:
determine a position and/or an orientation of a virtual blade of a virtual weapon based on the visual output signals and/or the motion and/or orientation output signals;
determine the overlay image comprising the virtual blade, wherein the virtual blade is placed within the overlay image according to the position and/or the orientation of the virtual blade;
effectuate displaying of the overlay image on the display so that the virtual blade appears to be attached to, and extending from, the hilt;
detect a real-world object based on the visual output signals and determine an object position and/or an object orientation of the real-world object;
determine when the virtual blade touches the real-world object based on the position and/or the orientation of the virtual blade and the object position and/or the object orientation of the real-world object;
determine controls for the one or more gyroscopes based on when the virtual blade touches the real-world object; and
effectuate operation of the one or more gyroscopes in accordance with the controls for the one or more gyroscopes to provide resistance to changing a hilt orientation of the hilt, wherein the resistance to changing the hilt orientation of the hilt simulates a feel of contact between the virtual blade and the real-world object.

2. The system of claim 1, wherein the one or more processors are further configured to:
determine changes in the position and/or the orientation of the virtual blade; and
determine the controls for the one or more gyroscopes based on the changes in the position and/or the orientation of the virtual blade.

3. The system of claim 1, wherein the one or more processors are further configured to:
change a shape and/or a size of the virtual blade; and
determine the controls for the one or more gyroscopes based on the shape and/or the size of the virtual blade.

4. The system of claim 1, wherein the one or more processors are further configured to select the virtual blade based on a user input received through an input device.

5. The system of claim 1, wherein the one or more processors are further configured to:
detect presence of a physical landmark carried by the hilt;
identify the physical landmark carried by the hilt;
access information that matches different physical landmarks to different virtual blades; and
select, based on the information that matches the different physical landmarks to the different virtual blades, the virtual blade based on the physical landmark carried by the hilt being matched to the virtual blade.

6. The system of claim 1, wherein the motion and orientation sensor includes an inertial measurement unit.

7. The system of claim 1, wherein the one or more gyroscopes include a first gyroscope carried in a first portion of the hilt and a second gyroscope carried in a second portion of the hilt, wherein the first portion and the second portion are located in different ends of the hilt.

8. The system of claim 1, further comprising a speaker, wherein the one or more processors are further configured to effectuate operation of the speaker in response to changes in the position and/or the orientation of the virtual blade based on the visual output signals and/or the motion and/or orientation output signals.

9. The system of claim 1, wherein the real-world object is separate and distinct from a user holding the hilt.

10. A method to simulate a feel of using a virtual weapon, the method comprising:
generating visual output signals conveying visual information within a field of view of an image sensor;
generate motion and/or orientation output signals conveying motion and/or orientation information of a hilt;
determining a position and/or an orientation of a virtual blade of the virtual weapon based on the visual output signals and/or the motion and/or orientation output signals;
determining an overlay image comprising the virtual blade, wherein the virtual blade is placed within the overlay image according to the position and/or the orientation of the virtual blade;
effectuating displaying of the overlay image on a display so that the virtual blade appears to be attached to, and extending from, the hilt;
detecting a real-world object based on the visual output signals and determining an object position and/or an object orientation of the real-world object;
determining when the virtual blade touches the real-world object based on the position and/or the orientation of the virtual blade and the object position and/or the object orientation of the real-world object;
determining controls for one or more gyroscopes carried by the hilt based on when the virtual blade touches the real-world object; and
effectuating operation of the one or more gyroscopes in accordance with the controls for the one or more gyroscopes to provide resistance to changing a hilt orientation of the hilt, wherein the resistance to changing the hilt orientation of the hilt simulates a feel of contact between the virtual blade and the real-world object.

11. The method of claim 10, further comprising:
determining changes in the position and/or the orientation of the virtual blade; and
determining the controls for the one or more gyroscopes based on the changes in the position and/or the orientation of the virtual blade.

12. The method of claim 10, further comprising:
changing a shape and/or a size of the virtual blade; and
determining the controls for the one or more gyroscopes based on the shape and/or the size of the virtual blade.

13. The method of claim 10, further comprising selecting the virtual blade based on a user input received through an input device.

14. The method of claim 10, further comprising:
detecting presence of a physical landmark carried by the hilt;
identifying the physical landmark carried by the hilt;
accessing information that matches different physical landmarks to different virtual blades; and
selecting, based on the information that matches the different physical landmarks to the different virtual blades, the virtual blade based on the physical landmark carried by the hilt being matched to the virtual blade.

15. The method of claim 10, wherein the motion and/or orientation output signals are generated by a motion and orientation sensor comprising an inertial measurement unit.

16. The method of claim 10, wherein the one or more gyroscopes include a first gyroscope carried in a first portion of the hilt and a second gyroscope carried in a second portion of the hilt, wherein the first portion and the second portion are located in different ends of the hilt.

17. The method of claim 10, further comprising effectuating operation of a speaker in response to changes in the position and/or the orientation of the virtual blade based on the visual output signals and/or the motion and/or orientation output signals.

18. The method of claim 10, wherein the real-world object is separate and distinct from a user holding the hilt.

19. A system to simulate a feel of using a virtual weapon, the system comprising:
a display configured to display an overlay image;
a speaker;
an image sensor configured to generate visual output signals conveying visual information within a field of view of the image sensor;
a hilt;
a motion and orientation sensor carried by the hilt, the motion and orientation sensor being configured to generate motion and/or orientation output signals conveying motion and/or orientation information of the hilt;
one or more gyroscopes carried by the hilt, wherein the one or more gyroscopes include a first gyroscope carried in a first portion of the hilt and a second gyroscope carried in a second portion of the hilt, wherein the first portion and the second portion are located in different ends of the hilt; and
one or more processors configured by machine readable instructions to:
detect presence of a physical landmark carried by the hilt;
identify the physical landmark carried by the hilt;
access information that matches different physical landmarks to different virtual blades; and
select, based on the information that matches the different physical landmarks to the different virtual blades, a virtual blade of a virtual weapon based on the physical landmark carried by the hilt being matched to the virtual blade;
determine a position and/or an orientation of the virtual blade of the virtual weapon based on the visual output signals and/or the motion and/or orientation output signals;
determine the overlay image comprising the virtual blade, wherein the virtual blade is placed within the overlay image according to the position and/or the orientation of the virtual blade;
effectuate displaying of the overlay image on the display so that the virtual blade appears to be attached to, and extending from, the hilt;
effectuate operation of the speaker in response to changes in the position and/or the orientation of the virtual blade based on the visual output signals and/or the motion and/or orientation output signals;

detect a real-world object based on the visual output signals and determine an object position and/or an object orientation of the real-world object;

determine when the virtual blade touches the real-world object based on the position and/or the orientation of the virtual blade and the object position and/or the object orientation of the real-world object;

determine controls for the one or more gyroscopes based on when the virtual blade touches the real-world object; and effectuate operation of the one or more gyroscopes in accordance with the controls for the one or more gyroscopes to provide resistance to changing a hilt orientation of the hilt, wherein the resistance to changing the hilt orientation of the hilt simulates a feel of contact between the virtual blade and the real-world object.

20. The system of claim 19, wherein the one or more processors are further configured to:

determine the changes in the position and/or the orientation of the virtual blade; and determine the controls for the one or more gyroscopes based on the changes in the position and/or the orientation of the virtual blade.

21. The system of claim 19, wherein the real-world object is separate and distinct from a user holding the hilt.

* * * * *